United States Patent
Choi et al.

(10) Patent No.: US 8,107,275 B2
(45) Date of Patent: Jan. 31, 2012

(54) NONVOLATILE MEMORY DEVICE USING VARIABLE RESISTIVE ELEMENT

(75) Inventors: Byung-Gil Choi, Yongin-si (KR); Joon-Yong Choi, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 87 days.

(21) Appl. No.: 12/630,484

(22) Filed: Dec. 3, 2009

(65) Prior Publication Data

US 2010/0142254 A1 Jun. 10, 2010

(30) Foreign Application Priority Data

Dec. 5, 2008 (KR) ........................ 10-2008-0123282

(51) Int. Cl.
*G11C 11/00* (2006.01)
(52) U.S. Cl. .................... 365/148; 365/163; 365/189.09
(58) Field of Classification Search .................. 365/148, 365/163, 189.09
See application file for complete search history.

(56) References Cited

U.S. PATENT DOCUMENTS

2009/0086532 A1* 4/2009 Tsuchida ...................... 365/158

FOREIGN PATENT DOCUMENTS

| JP | 2002-260378 | 9/2002 |
| JP | 2007-080424 | 3/2007 |
| KR | 1020060056687 | 5/2006 |

OTHER PUBLICATIONS

English Abstract for Publication No. 2002-260378.
English Abstract for Publication No. 1020060056687.
English Abstract for Publication No. 2007-080424.

* cited by examiner

*Primary Examiner* — Huan Hoang
(74) *Attorney, Agent, or Firm* — F. Chau & Associates, LLC

(57) ABSTRACT

A nonvolatile memory device using a variable resistive element is provided. The nonvolatile memory device includes first and second nonvolatile memory cells. Word lines are coupled to the first and second nonvolatile memory cells. First and second bit lines are coupled to the first and second nonvolatile memory cells, respectively. A read circuit reads resistance levels of the first and second nonvolatile memory cells by providing first and second read bias currents of different levels to the first and second bit lines, respectively.

10 Claims, 8 Drawing Sheets

__NONVOLATILE MEMORY DEVICE USING VARIABLE RESISTIVE ELEMENT__

CROSS-REFERENCE TO RELATED APPLICATION

This application claims priority to and the benefit of Korean Patent Application No. 10-2008-0123282, filed on Dec. 5, 2008 in the Korean Intellectual Property Office, the entire content of which is incorporated by reference herein.

BACKGROUND

1. Technical Field

The present disclosure relates to memory devices, and, more particularly, to nonvolatile memory devices using a variable resistive element.

2. Discussion of the Related Art

Nonvolatile memory devices using a resistance material include phase change random access memories (PRAMs), resistive RAM (RRAMs), magnetic RAMs (MRAMs), and the like. A dynamic RAM (DRAM) or a flash memory device stores data using charges, whereas the nonvolatile memory device using the resistance material stores data using a phase change of a phase change material such as a chalcogenide alloy (in the case of a PRAM), a resistance change of a variable resistance material (in the case of an RRAM), a resistance change of a magnetic tunnel junction (MTJ) thin film according to a magnetization state of a ferromagnetic material (in the case of an MRAM), and the like.

More specifically, the phase change material is changed to a crystalline state or an amorphous state as it is cooled after being heated. The phase change material in a crystalline state has a low resistance and the phase change material in an amorphous state has a high resistance. Accordingly, the crystalline state may be defined as set data or "0" data, and the amorphous state may be defined as reset data or "1" data.

SUMMARY

In accordance with exemplary embodiments of the inventive concept, a nonvolatile memory device having an improved reliability of a read operation is provided.

In an exemplary embodiment a nonvolatile memory device includes at least a first nonvolatile memory cell and a second nonvolatile memory cell. A word line is coupled to the first nonvolatile memory cell and to the second nonvolatile memory cell. A first bit line is coupled to the first nonvolatile memory cell. A second bit line is coupled to the second nonvolatile memory cell. A read circuit reads a resistance level of the first nonvolatile memory cell and a resistance level of the second nonvolatile memory cell by providing first read bias current and second read bias current of different levels to the first bit line and to the second bit line, respectively.

The word line may include a first sub word line and a second sub word line connected to each other through a strapping node. The first nonvolatile memory cell may be nearer to the strapping node than the second nonvolatile memory cell. A level of the first read bias current may be lower than a level of the second read bias current.

The first sub word line may be a polysilicon layer, and the second sub word line may be a metal layer formed on the polysilicon layer.

The read circuit may include a first read bias providing unit that provides the first read bias current, and a second read bias providing unit that provides the second read bias current. The first read bias providing unit and the second read bias providing unit may be selectively enabled in response to a biasing selection signal formed using an address signal.

The first read bias providing unit may provide the first read bias current using a first control bias, and the second read bias providing unit may provide the second read bias current using a second control bias having a different level from the first control bias.

The first read bias providing unit may provide the first read bias current using a control bias applied to a gate of a first transistor. The second read bias providing unit may provide the second read bias current using the control bias applied to a gate of a second transistor. The first transistor and the second transistor may have different resistance levels.

The read circuit may include a sensing node coupled to the first read bias providing unit and the second read bias providing unit, and selectively coupled to the first bit line and the second bit line, and a sensing unit coupled to the sensing node to compare the level of the sensing node with the level of a reference bias to output a comparison result.

The read circuit may include a first sensing node coupled to the first bit line and the first read bias providing unit, a first sensing unit coupled to the first sensing node to compare the level of the first sensing node with the level of a reference bias to output a comparison result, a second sensing node coupled to the second bit line and the second read bias providing unit, and electrically separated from the first sensing node, and a second sensing unit coupled to the second sensing node to compare the level of the second sensing node with the level of the reference bias to output a comparison result.

The read circuit may include a control bias providing unit that selects one of drive biases having different levels in accordance with addresses and provides the selected drive bias as a control bias, and a read bias providing unit that provides the read bias current using the control bias.

The nonvolatile memory cell may be a diode-controlled PRAM cell.

In accordance with an exemplary embodiment a non-volatile memory device includes a first memory cell coupled to a first bit line and a word line. A second memory cell is coupled to the word line and to a second bit line adjacent the first bit line, the word line having a resistance between the first memory cell and the second memory cell. A read bias current providing apparatus is configured to provide a first bias current to the first memory cell and a second bias current to the second memory cell. A current level differential between the first bias current and a second bias current corresponds to the resistance of the word line between the first memory cell and the second memory cell.

In accordance with an exemplary embodiment a non-volatile memory device for determining data stored in non-volatile memory cells of a memory array, the non-volatile memory device includes a first memory cell coupled to a first bit line and a word line. A second memory cell is coupled to the word line and to a second bit line adjacent the first bit line, the word line having a resistance between the first memory cell and the second memory cell. A read bias current providing apparatus is configured to provide a first bias current to the first memory cell and a second bias current to the second memory cell. A current sensor is coupled to the first bit line and to the second bit line. A current level differential between the first bias current and the second bias current corresponds to the resistance of the word line between the first memory cell and the second memory cell. The current sensor determines the data stored in the first memory cell by comparing the first bias current with a reference level and determines the data stored in the second memory cell by comparing the second bias current with the reference level. The word line includes a first sub word line and a second sub word line. The first bit line and the second bit line are located between the first sub word line and the second sub word line. A first variable resistance couples the first bit line with the word line and a second variable resistance couples the second bit line with the word line.

The first variable resistance and/or the second variable resistance may be a phase change material which in a crystalline state has a low resistance and which in an amorphous state has a high resistance.

The first memory cell is closer to ground than the second memory cell.

BRIEF DESCRIPTION OF THE DRAWINGS

The exemplary embodiments of the inventive concept will be more apparent from the following detailed description taken in conjunction with the accompanying drawings, in which.

DETAILED DESCRIPTION OF THE EMBODIMENTS

Figure 1:
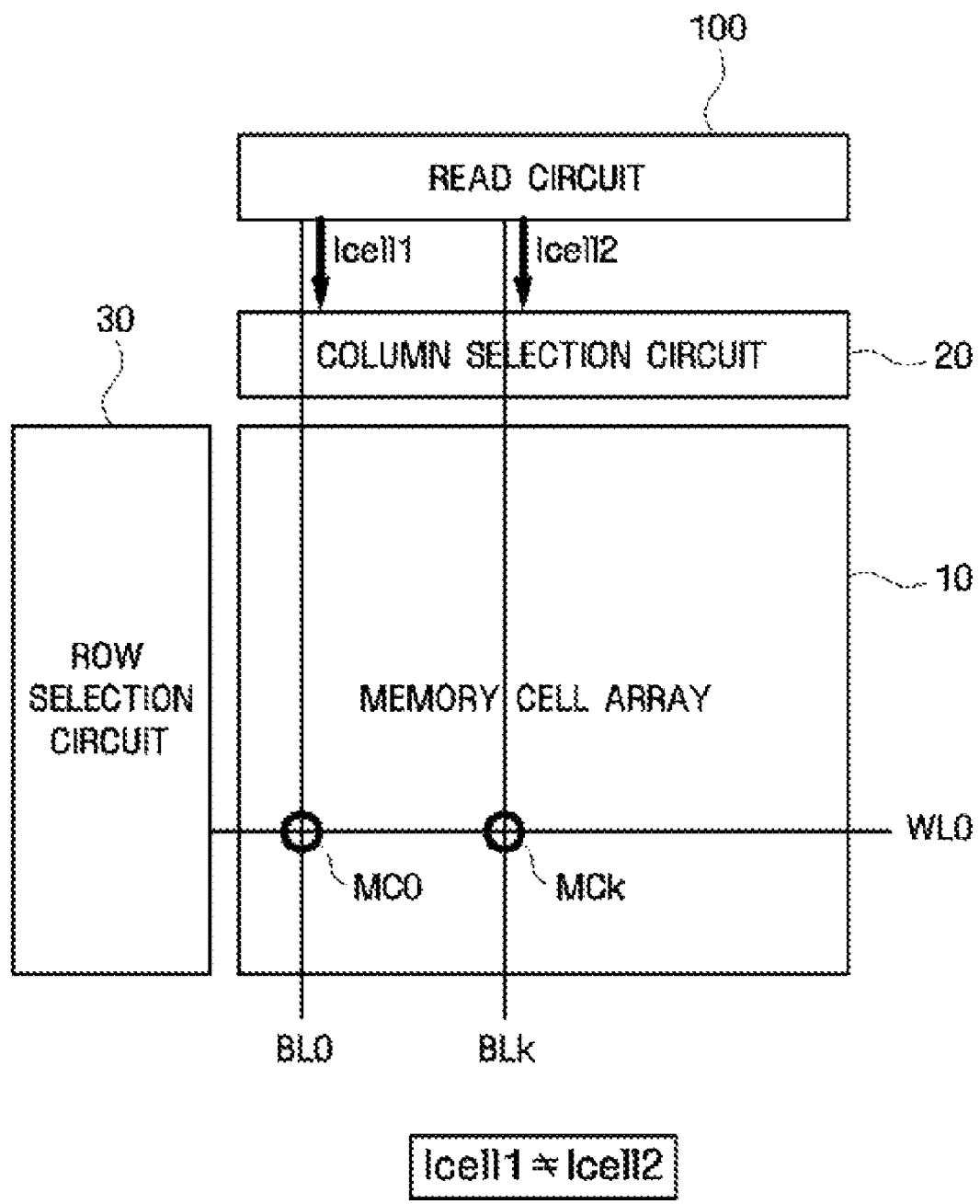
FIG. 1 is a block diagram explaining a nonvolatile memory device according to an exemplary embodiment of the inventive concept.

Hereinafter, the same drawing reference numerals are used for the same elements across various figures.

The term "connected to" or "coupled to" that is used to designate a connection or coupling of one element to another element includes both a case that an element is "directly connected or coupled to" another element and a case that an element is connected or coupled to another element via another element. In this case, the term "directly connected to" or "directly coupled to" means that an element is connected or coupled to another element without intervention of any other element. In the entire description of the present inventive concept, the same drawing reference numerals are used for the same elements across various figures. Also, the term "and/or" includes the respective described items and combinations thereof.

Although the terms "first, second, and so forth" are used to describe diverse elements, components and/or sections, such elements, components and/or sections are not limited by the terms. In the following description, a first element, first component, or first section may be a second element, second component, or second section.

Hereinafter, exemplary embodiments of the inventive concept will be described using a phase change memory device, i.e. a phase change RAM (PRAM). However, it will be apparent to those of ordinary skill in the art to which the present invention pertains that the present invention can be applied to all nonvolatile memories using resistance materials, such as a resistive RAM (RRAM), a ferroelectric RAM (FRAM), and a magnetic RAM (MRAM).

Figure 2:
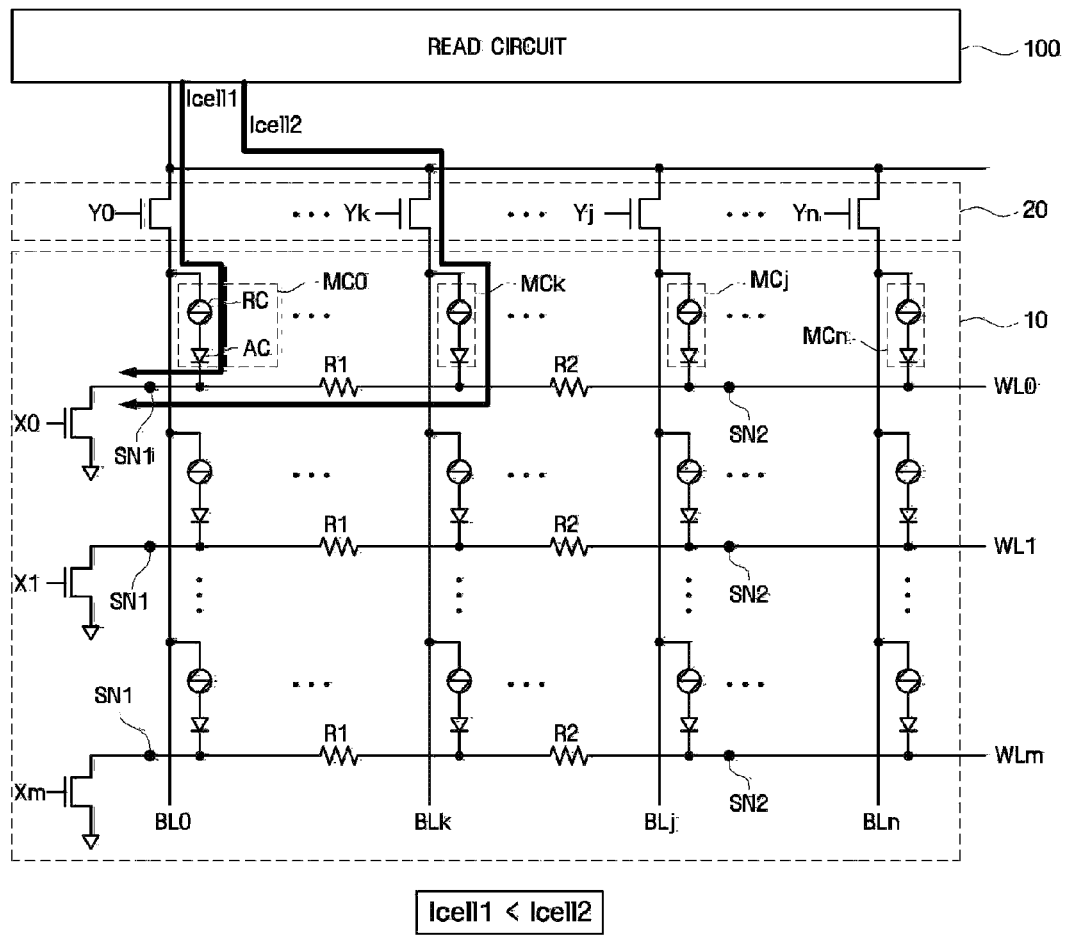
FIG. 2 is a circuit diagram for explaining a memory cell array of FIG. 1 and its general operation.

FIG. 1 is a block diagram explaining a nonvolatile memory device according to an exemplary embodiment of the inventive concept and FIG. 2 is a circuit diagram for explaining a memory cell array of FIG. 1 and its general operation. For convenience in explanation, a row selection circuit is not illustrated in FIG. 2, but parasitic resistances of word lines are illustrated therein. Although only strapping nodes SN1, SN2 existing in the neighborhood of bit lines BL0, BLj are illustrated in FIG. 2, the inventive concept is not limited thereto. It would be understood that strapping nodes can also be formed for j+1 bit lines in the neighborhood of other bit lines.

Referring to FIGS. 1 and 2, a nonvolatile memory device according to an exemplary embodiment of the inventive concept includes a memory cell array 10, a column selection circuit 20, a row selection circuit 30, and a read circuit 100.

The memory cell array 10 includes a plurality of nonvolatile memory cells MC0-MCn arranged in the form of a matrix. Rows of the nonvolatile memory cells MC0-MCn are coupled to word lines WL0-WLn, respectively, and columns of the nonvolatile memory cells MC0-MCn are coupled to bit lines BL0-BLn, respectively.

The nonvolatile memory cell (e.g. MC0) may include a variable resistive element RC including a phase change material having different resistance values in accordance with its crystalline state or amorphous state, and an access element AC controlling current flowing through the variable resistive element RC. Here, the access element AC may be a diode, a transistor, or the like, which is coupled in series to the variable resistive element RC. In the exemplary embodiment depicted in FIG. 2, the access element AC is a diode. However, the access element is not limited thereto. The phase change nonvolatile memory cell using a diode as the access element AC is called a diode-controlled PRAM cell. Also, the phase change material may include GaSb, InSb, InSe, $Sb_2Te_3$, GeTe, which are obtained by combining two elements, GeSbTe, GaSeTe, InSbTe, $SnSb_2Te_4$, InSbGe, which are obtained by combining three elements, and AgInSbTe, (GeSn)SbTe, GeSb(SeTe), $Te_{81}Ge_{15}Sb_2S_2$, which are obtained by combining four elements. Among them, GeSbTe, which is composed of germanium (Ge), antimony (Sb), and tellurium (Te), is mainly used.

In an exemplary embodiment, each of the nonvolatile memory cells MC0-MCn can store one-bit data by having the variable resistive element RC set to a set resistance state or a reset resistance state. However, the nonvolatile memory cell is not limited thereto. The respective nonvolatile memory cell may be a multi-level memory cell (MLC) that stores data of more than one bit by having the variable resistive element RC set to multi-levels.

Although not illustrated in the drawing, since the nonvolatile memory device has a large capacity and is highly integrated, word lines WL0-WLn of the nonvolatile memory device may be constructed as a hierarchical word line structure using main word lines and sub word lines. Also, bit lines BL0-BLn of the nonvolatile memory device may be constructed as a hierarchical bit line structure using global bit lines and local bit lines.

The row selection circuit 30 selects a word line of the word lines WL0-WLn (e.g. WL0) in response to a row selection signal X0 of the row selection signals X0-Xn, and the column selection circuit 20 selects a bit line of the bit lines BL0-BLn (e.g. BL0) in response to a column selection signal Y0 of the column selection signals Y0-Yn.

The read circuit 100 is a circuit to read data stored in the selected nonvolatile memory cells MC0-MCn in the memory cell array 10. Specifically, the read circuit 100 can read resistance levels of the nonvolatile memory cells MC0-MCn by providing read bias currents Icell1, Icell2 to the selected nonvolatile memory cells MC0-MCn.

Particularly, in the nonvolatile memory device according to an exemplary embodiment of the inventive concept, the read circuit 100 reads data stored in the first nonvolatile memory cell (e.g. MC0) by providing the first read bias current Icell1 to the first nonvolatile memory cell (e.g. MC0) among the nonvolatile memory cells MC0-MCn coupled to the word line (e.g. WL0), and reads data stored in the second nonvolatile memory cell (e.g. MCk) by providing the second read bias current Icell2 to the second nonvolatile memory cell (e.g. MCk). Here, the first read bias current Icell1 and the second read bias current Icell2 may have different levels. The details of the read circuit 100 as described above will be described below with reference to FIGS. 5 to 8.

Hereinafter, with reference to FIGS. 2 to 4, a read operation of the nonvolatile memory device according to an exemplary embodiment of the inventive concept will be described in more detail.

Figure 3:
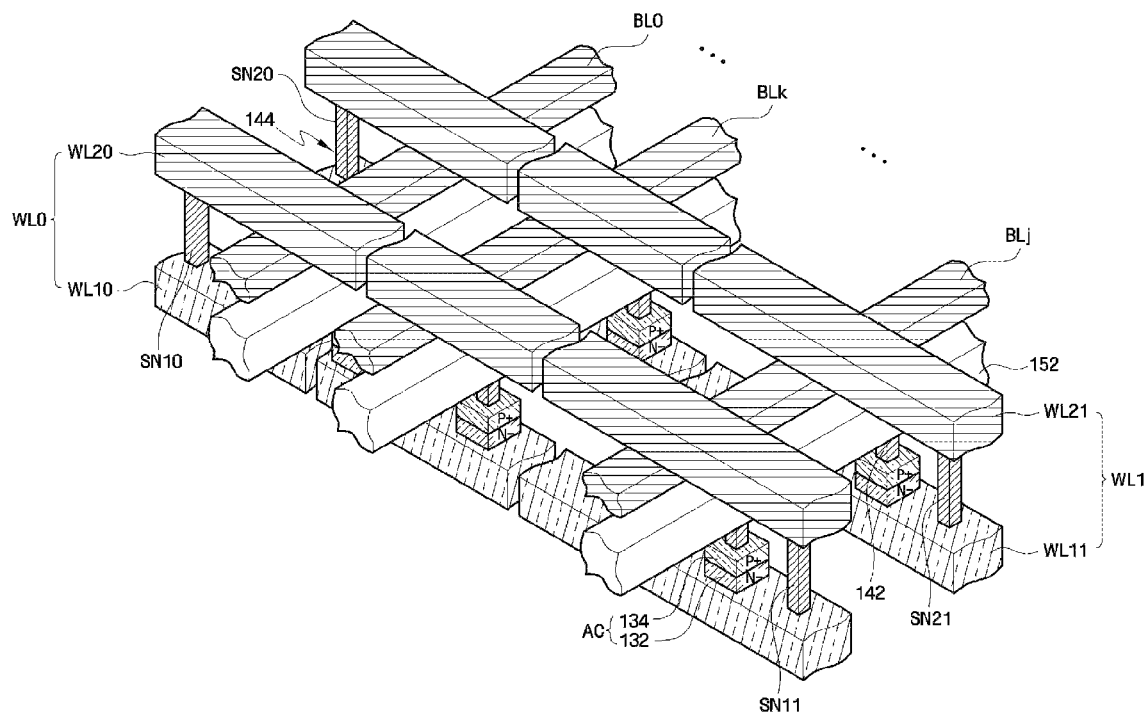
FIG. 3 is a perspective view for explaining a nonvolatile memory device including strapping nodes of FIG. 2.
Figure 4:
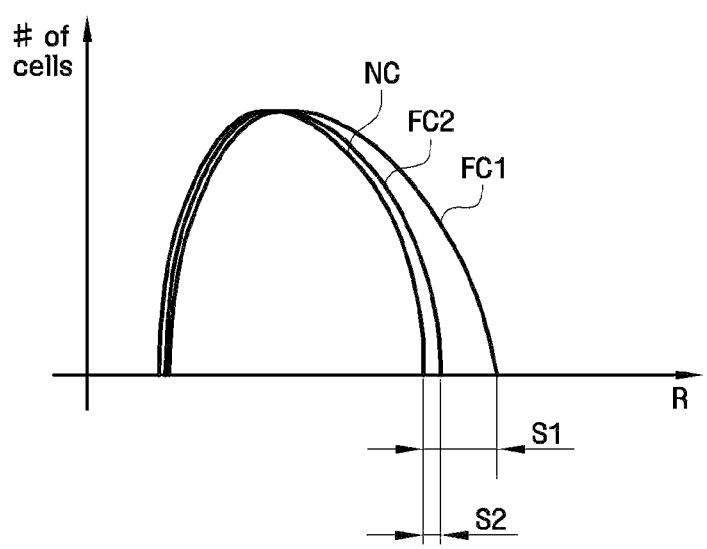
FIG. 4 is a graph depicting the relationships between read bias current and resistance dispersion.

FIG. 3 is an exemplary perspective view explaining a nonvolatile memory device including strapping nodes of FIG. 2, and FIG. 4 is a graph depicting the relationship between read bias current and resistance dispersion. For convenience in explanation, illustration of an interlayer insulating film, intermetal insulating film, and the like, is omitted in FIG. 3. Although only word lines WL0, WL1 are illustrated in FIG. 3, word lines are not limited thereto. It would be understood that the same structure can be applied to other word lines WL2-Wln.

Referring to FIGS. 2 and 3, during a read operation, the read circuit 100 reads the resistance levels of the nonvolatile memory cells MC0, MCk by providing the read bias currents Icell1, Icell2 to the selected nonvolatile memory cells (e.g. MC0, MCk). That is, as the read bias currents Icell1, Icell2 flow to ground through the selected bit lines (e.g. BL0, BLk), the nonvolatile memory cells MC0, MCk, and the word line (e.g. WL0), the read circuit 100 can read data stored in the nonvolatile memory cells MC0, MCk by sensing the voltage level change or current level change of sensing nodes coupled to the bit lines BL0, BLk.

However, if the read circuit 100 provides the read bias current of the same level to the nonvolatile memory cells MC0-MCn coupled to the word lines WL0-Wln, resistances having different distributions may be read in accordance with positions (specifically, column addresses) of the nonvolatile memory cells MC0-MCn. For example, there is a resistance difference due to a difference in physical length of the word lines WL0-Wln between ground and the first nonvolatile memory cell (e.g. MC0), which is relatively near the ground, and ground and the second nonvolatile memory cell (e.g. MCk), which is relatively far from the ground, and thus the resistances having different distributions may be read.

Also, as illustrated in FIG. 3, if the word lines WL0, WL1 include first sub word lines WL10, WL11 and second sub word lines WL20, WL21 having resistances smaller than those of the first sub word lines WL10, WL11, i.e. strapping lines, a resistance difference between the word lines WL0, WL1 may exist in accordance with a distance difference between the nonvolatile memory cells MC0-MCn coupled to the first sub word lines WL10, WL11 and the strapping nodes SN1, SN2, and thus the resistances having different distributions are read to cause a read error to occur.

Specifically, if the word lines of the nonvolatile memory device include the strapping lines as illustrated in FIG. 3, the nonvolatile memory device includes first sub word lines WL10, WL11 successively laminated, first and second semiconductor patterns 132, 134, variable resistance patterns 152, bit lines BL0-BLj, and second sub word lines WL20, WL21. Here, the first sub word lines WL10, WL11 are connected to the second sub word lines WL20, WL21 through strapping contact plugs SN10, SN20, SN11, SN21, and form the word lines WL0, WL1 of FIG. 2 together with the second sub word lines WL20, WL21.

The first sub word lines WL10, WL11 are formed of a conductive material, such as polysilicon or metal, to extend in the first direction. For example, in the case where the first sub word lines WL10, WL11 are formed of polysilicon, the first sub word lines WL10, WL11 may be of N+ type, and particularly may be N+ epitaxial layers. Here, in the case where a single-crystalline semiconductor substrate is used as a semiconductor substrate, the first sub word lines WL10, WL11 may also be of a single crystal.

On the first sub word lines WL10, WL11, for example, N−type first semiconductor patterns 132 and P+ type second semiconductor patterns 134, which are laminated on the first semiconductor patterns 132, respectively, are formed. Specifically, the first and second semiconductor patterns 132, 134 are separately arranged in the first direction (i.e. extending direction of the word lines) on the first sub word lines WL10, WL11, respectively, and form access elements AC, i.e. cell diodes, of the nonvolatile memory cells MC0-MCn.

The variable resistance patterns 152 extend in the second direction on the first and second semiconductor patterns 132, 134 to cross the first sub word lines WL10, WL11, and are connected to the first and second semiconductor patterns 132, 134 through lower electrode contacts 142. Here, the variable resistance patterns 152 may be formed of a phase change material as described above. In the drawing, the variable resistance patterns 152 are illustrated as a line type in which the variable resistance patterns 152 are arranged to correspond to the phase change nonvolatile memory cells, but are not limited thereto. The variable resistance patterns 152 may be formed of a dot type in which the phase change material is arranged in the unit of a variable resistance cell.

On the variable resistance patterns 152, the bit lines BL0-BLj are extended in parallel to the variable resistance patterns 152, and are arranged to cross the first sub word lines WL10, WL11 and the second sub word lines WL20, WL21. Here, the bit lines BL0-BLj are connected to the variable resistance patterns 152 through bit line contact plugs (not illustrated), and are made of metal such as aluminum (Al) or tungsten (W).

The second sub word lines WL20, WL21 are arranged to extend in parallel to the first sub word lines WL10, WL11 on the bit lines BL0-BLj, and are connected to the first sub word lines WL10, WL11 through the strapping line contact plugs SN10, SN20, SN11, SN21. Here, nodes on which the first sub word lines WL10, WL11 are connected to the second sub word lines WL20, WL21 through the strapping line contact plugs SN10, SN20, SN11, SN12 may be the strapping nodes SN1, SN2 of FIG. 2.

The second sub word lines WL20, WL21, which are strapping lines, are made of a material having resistance lower than that of the first sub word lines WL10, WL11, such as aluminum or tungsten, and are connected to the variable resistance patterns 152 through the first sub word lines WL10, WL11. In the drawing, the second sub word lines WL20, WL21 are illustrated so that they are arranged on an upper part of the bit lines BL0-BLj. However, the arrangement of the second sub word lines is not limited thereto. In the case where the second sub word lines WL20, WL21 correspond to metal layers arranged on an upper part of the first sub word lines WL10, WL11, they may be arranged on a lower part of the bit lines BL0-BLn.

If the word lines WL0-Wln are composed of the first sub word lines WL10, WL11 and the second sub word lines WL20, WL21 that are strapping lines, the nonvolatile memory cells MC0-MCn coupled to the word line WL0 may have non-constant resistance as seen from the nonvolatile memory cells MC0-MCn to ground along the column address. That is, the nonvolatile memory cells MC0-MCn coupled to the word line WL0 may have non-constant resistance, as seen from the selected nonvolatile memory cells MC0-MCn to ground, due to a distance difference between the nonvolatile memory cells MC0-MCn selected according to the column addresses and the first sub word line WL10 between the strapping nodes SN1, SN2. For example, the resistance as seen from the second nonvolatile memory cell MCk, which is relatively far from the strapping nodes SN1, SN2, to ground is higher by R1 or R2 than the resistance as seen from the first nonvolatile memory cells MC0, MCj, which is relatively near the strapping nodes SN1, SN2, to ground. Here, R1 indicates the resistance of the first sub word line WL10 existing between the second nonvolatile memory cell MCk and the first strapping node SN1, and R2 indicates the resistance of the first sub word line WL10 existing between the second nonvolatile memory cell MCk and the second strapping node SN 2.

Accordingly, in the case where the read bias currents having the same level are provided to the nonvolatile memory cells MC0-MCn, the read resistance level may differ in accordance with the positions of the nonvolatile memory cells MC0-MCn coupled to the word lines WL0-Wln even if the resistances of the same level are stored in the nonvolatile memory cells MC0-MCn.

For example, the second nonvolatile memory cell MCk, which is relatively far from the strapping nodes SN1, SN2, may read the resistance that is relatively higher than that of the first nonvolatile memory cells MC0, MCj, which are relatively near the strapping nodes SN1, SN2. Accordingly, the second nonvolatile memory cell MCk which is relatively far from the strapping nodes SN1, SN2, as illustrated in FIG. 2, may have a reduced sensing margin in comparison to the first nonvolatile memory cells MC0, MCj which are relatively near the strapping nodes SN1, SN2, and this may cause an error occurrence during a read operation.

However, the read circuit 100 of the nonvolatile memory device according to an exemplary embodiment of the inventive concept reads the resistance levels of the first and second nonvolatile memory cells MC0, MCk by providing the first and second read bias currents Icell1, Icell2 having different levels to the first and second nonvolatile memory cells MC0, MC among the nonvolatile memory cells MC0-MCn coupled to the word lines WL0-Wln, and thus the above-described read error can be prevented from occurring. Specifically, in the case where the read circuit 100 of the nonvolatile memory device according to an exemplary embodiment of the inventive concept reads data stored in the first nonvolatile memory cells MC0, MCj which are relatively near the strapping nodes SN1, SN2, it reads the resistance levels stored in the first nonvolatile memory cells MC0, MCj by providing the first read bias current Icell1 of a relatively low level. By contrast, in the case of reading data stored in the second nonvolatile memory cell MCk which is relatively far from the strapping nodes SN1, SN2, the read circuit 100 reads the resistance level stored in the second nonvolatile memory cell MCk by providing the second read bias current Icell2 of a relatively high level. Accordingly, even if the nonvolatile memory cells MC0-MCn coupled to the word lines WL0-Wln have non-constant resistance, as seen from the nonvolatile memory cells MC0-MCn to ground, according to the column addresses, the distributions of resistances read by the nonvolatile memory cells may substantially be equal irrespective of the positions of the nonvolatile memory cells MC0-MCn. This feature will now be described in more detail with reference to FIG. 4.

Referring to FIG. 4, x-axis represents resistance (R), and y-axis represents the number of nonvolatile memory cells. In FIG. 4, the resistance dispersion in a reset state according to the level change of the read bias current is omitted. However, the present invention is not limited thereto. Also, FIG. 4 illustrates the resistance dispersion NC of the nonvolatile memory cell that is relatively near the strapping node without taking into consideration whether the read bias current levels provided to the nonvolatile memory cells MC0-MCn are equal and are not equal. However, the resistance dispersion of the nonvolatile memory cell may be changed by adjusting the read bias current level that is provided to the nonvolatile memory cell existing relatively far from the strapping node.

For example, reference numerals NC, FC1 denote the resistance dispersion of the nonvolatile memory cell that is relatively near the strapping node and the resistance dispersion of the nonvolatile memory cell that is relatively far from the strapping node, respectively. Reference numerals NC, FC2 denote the resistance dispersion of the nonvolatile memory cell that is relatively near the strapping node and the resistance dispersion of the nonvolatile memory cell that is relatively far from the strapping node, respectively, in the case where the read bias current levels being provided to the nonvolatile memory cells MC0-MCn are not equal. It can be seen that the sensing margin S1 of NC, FC1 is greater than the sensing margin S2 of NC, FC2. That is, the nonvolatile memory device according to an exemplary embodiment of the inventive concept has an improved reliability during a read operation.

As described above, the read circuit 100 provides a first read bias current Icell1 and a second read bias current Icell2. However, the present invention is not limited thereto. For example, in an exemplary embodiment of the inventive concept, at least three read bias currents having different levels may be selectively provided in accordance with the positions of the nonvolatile memory cells coupled to the word lines.

Also, as described above, the first nonvolatile memory cells MC0, MCj are relatively near the strapping nodes SN1, SN2 and thus the first read bias current Icell1 is provided thereto. However, the present invention is not limited thereto. It would be understood that the first read bias current Icell1 can be provided to any nonvolatile memory cell that is relatively near the strapping nodes SN1, SN2.

Figure 5:
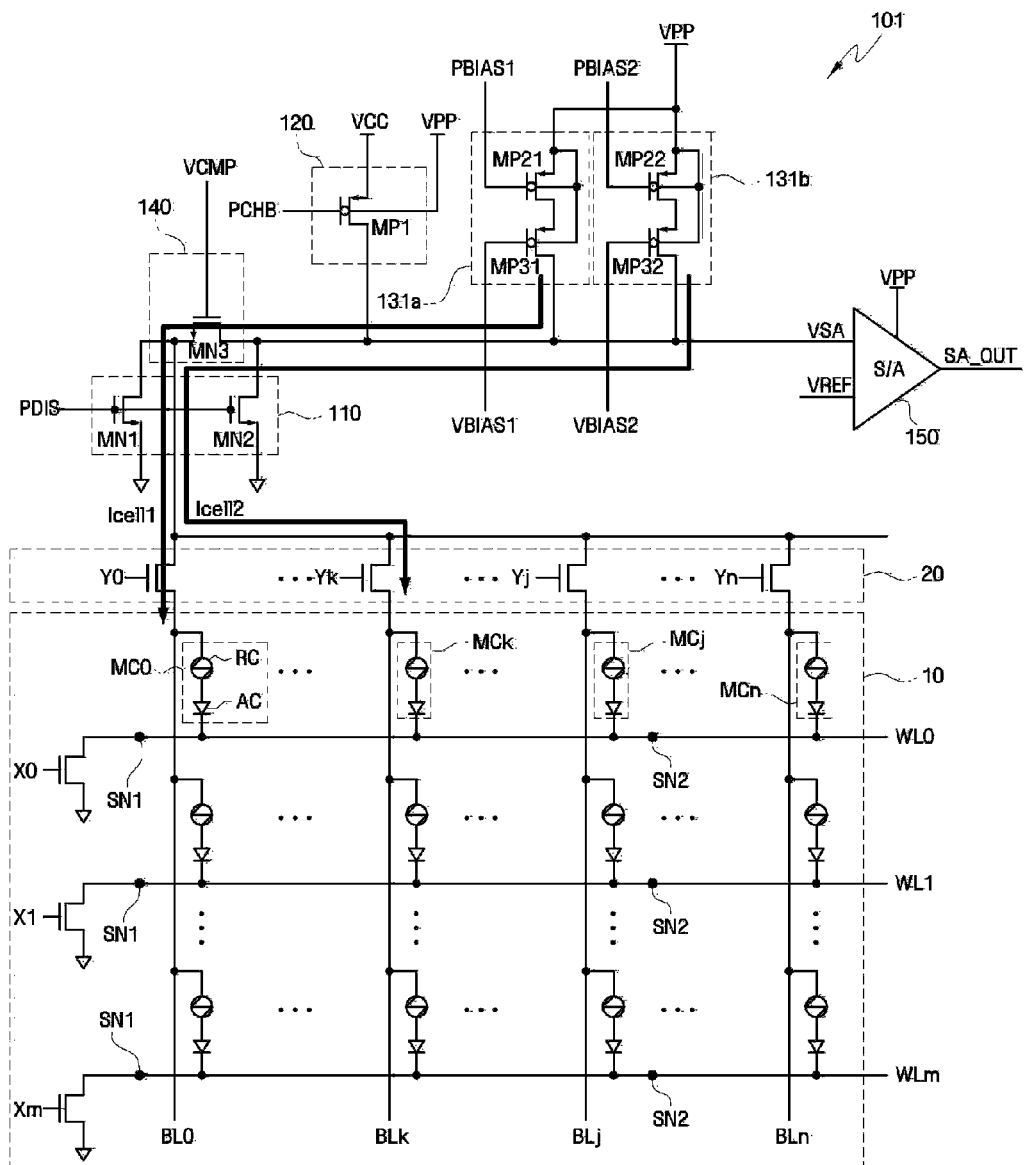
FIG. 5 is a circuit diagram for explaining the operation of a nonvolatile memory device according to an exemplary embodiment of the inventive concept.

FIG. 5 is a circuit diagram explaining an operation of a nonvolatile memory device according to an exemplary embodiment of the inventive concept. For convenience in explanation, the row selection circuit 30 of FIG. 1 is not illustrated in FIG. 5. Since the memory cell array 10 and the column selection circuit 20 have been described in detail with reference to FIG. 1, the detailed description thereof will be omitted.

Referring to FIG. 5, a read circuit 101 of a nonvolatile memory device according to an exemplary embodiment of the inventive concept includes a discharge unit 110, a precharge unit 120, a clamping unit 140, first read bias providing unit 131a and second read bias providing unit 131b, and a sensing unit 150.

The discharge unit 110 discharges a bit line (e.g. BL0) and/or a sensing node VSA coupled to a nonvolatile memory cell selected prior to a read operation to a specified level, for example, to a ground voltage VSS. The discharge unit 110 includes an NMOS transistor MN1 coupled between the bit line BL0 and the ground voltage VSS to receive a discharge signal PDIS through its gate, and an NMOS transistor MN2 coupled between the sensing node VSA and the ground voltage VSS to receive the discharge signal PDIS through its gate.

The precharge unit 120 precharges the sensing node VSA to a specified level, for example, to a supply voltage VCC, for a precharge period in a read operation. The precharge unit 120 includes a PMOS transistor MP1 coupled between the supply voltage VCC and the sensing node VSA to receive a precharge signal PCHB through its gate.

The clamping unit 140 clamps the bit line BL0 within a specified bias current level, for example, within a range proper to read. Specifically, the clamping unit 140 clamps the bit line BL0 within a specified level that is below a threshold voltage Vth of the phase change material. If the bias current level exceeds the threshold voltage Vth, the phase of the phase change material of the selected nonvolatile memory cells MC0-MCn may be changed. The clamping unit 140 includes an NMOS transistor MN3 coupled between the bit line BL0 and the sensing node VSA to receive a clamping control signal VCMP through its gate. Here, the clamping control signal VCMP may be, but is not limited to, a constant voltage signal.

The first and second read bias current providing units 131a, 131b provide read bias currents Icell1, Icell2 of different levels to the sensing node VSA in accordance with the positions (specifically, column addresses) of the selected nonvolatile memory cells MC0, MCk to read the resistance levels of the selected nonvolatile memory cells (e.g. MC0, MCk). Specifically, the first and second read bias current providing units 131a, 131b are selectively enabled in response to biasing selection signals PBIAS1, PBIAS2 formed using the column address signals, and provide the first read bias current Icell1 and the second read bias current Icell2 of a level relatively higher than that of the first read bias current Icell1 to the sensing node VSA, respectively. For example, in response to the column address for selecting the first nonvolatile memory cell MC0 which is relatively near the strapping nodes SN1, SN2, the first read bias providing unit 131a is selectively enabled to provide the first read bias current Icell1 to the sensing node VSA. By contrast, in response to the column address for selecting the second nonvolatile memory cell MCk which is relatively far from the strapping nodes SN1, SN2, the second read bias providing unit 131b is selectively enabled to provide the second read bias current Icell2 to the sensing node VSA.

The first and second read bias providing units 131a, 131b, as illustrated in FIG. 5, include first PMOS transistors MP21, MP22 coupled between a boosted voltage VPP and second PMOS transistors MP31, MP32, respectively, and second PMOS transistors MP31, MP32 coupled between the first PMOS transistors MP21, MP22 and the sensing node VSA, respectively. Here, a substrate region, on which the first and second PMOS transistors MP21, MP32 are formed, may be coupled to the boosted voltage VPP, respectively.

A first biasing selection signal PBIAS1 and a first control bias VBIAS1 are applied to gates of the first and second PMOS transistors MP21, MP31 of the first read bias providing unit 131a, while a second biasing signal PBIAS2 and a second control bias VBIAS2 having a voltage relatively higher than that of the first control bias VBIAS1 are applied to gates of the first and second PMOS transistors MP22, MP32 of the second read bias providing unit 131b. Accordingly, if the first read bias providing unit 131a is selectively enabled in response to the biasing selection signal PBIAS1, the first read bias current Icell1 of a relatively low level is provided to the sensing node VSA, while if the second read bias providing unit 131b is selectively enabled in response to the biasing selection signal PBIAS2, the second read bias current Icell2 of a relatively high level is provided to the sensing node VSA.

The sensing unit 150, during the read operation, compares the level of the sensing node VSA, which is changed as the first read bias current Icell1 or the second read bias current Icell2 are provided to the selected nonvolatile memory cells MC0-MCn, with a reference bias level VREF, and outputs a comparison result SA_OUT. For example, if the level of the sensing node VSA is higher than the reference bias level VREF, high-level comparison result SA_is output, while if the level of the sensing mode VSA is lower than the reference bias level VREF, low-level comparison result SA_OUT is output. The sensing unit 150 may be a current sense amplifier that senses the change of current flowing out through the bit lines BL-BLn of the nonvolatile memory cells MC0-MCn selected with respect to a reference current, or a voltage sense amplifier that senses the change of voltage with respect to a reference voltage. In the drawing, a voltage sense amplifier is illustrated as an example.

Figure 6:
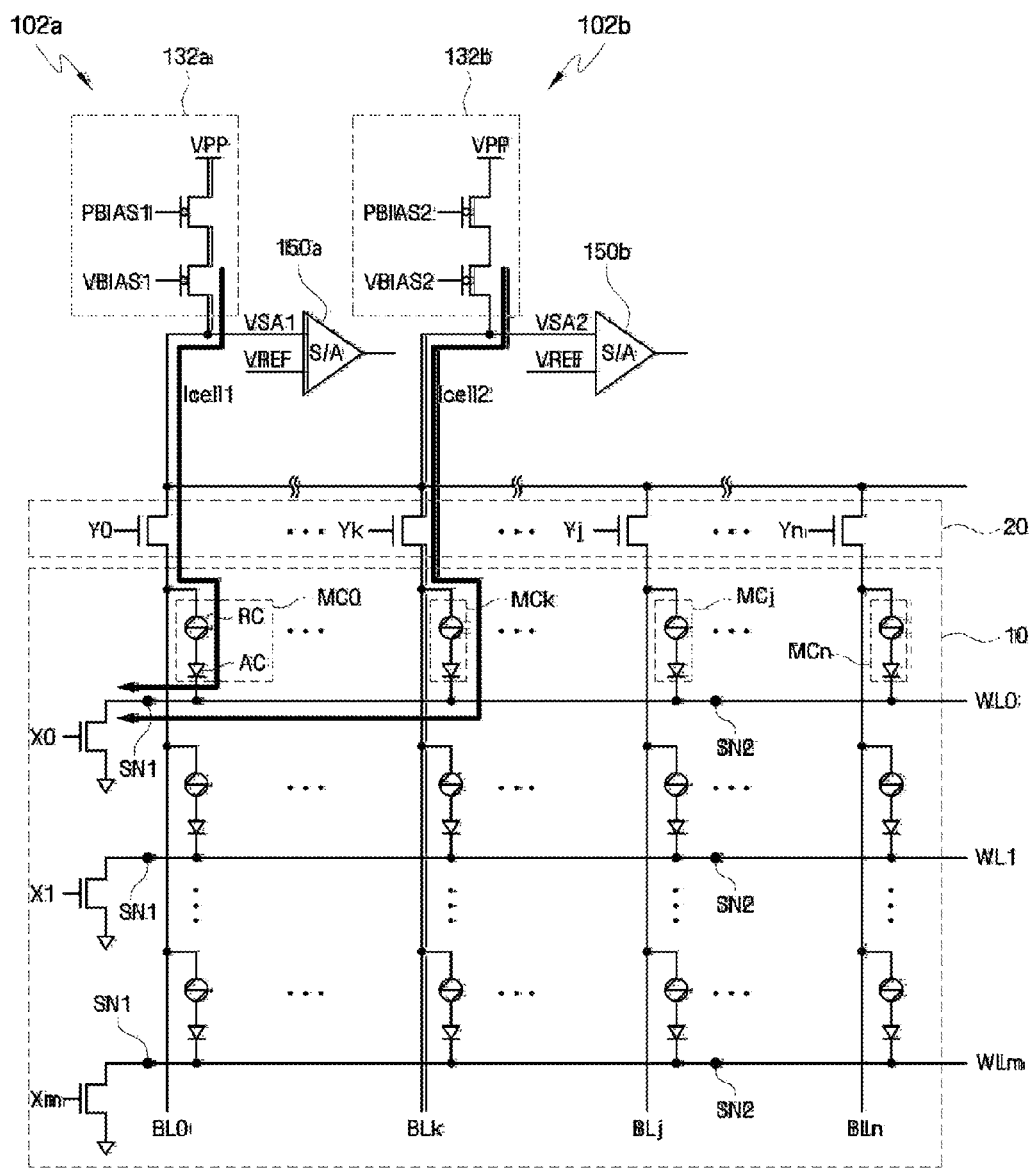
FIG. 6 is a circuit diagram for explaining the operation of a nonvolatile memory device according to an exemplary embodiment of the inventive concept.

FIG. 6 is a circuit diagram for explaining the operation of a nonvolatile memory device according to an exemplary embodiment of the inventive concept. For convenience in explanation, the discharge unit, the precharge unit, and the clamping unit of FIG. 5 are not illustrated in FIG. 6. Also, in FIG. 6, only first and second read circuits 102a, 102b are illustrated to read data stored in a part of the nonvolatile memory cells arranged between the first and second strapping nodes SN1, SN2. However, the present invention is not limited thereto. For example, it would be understood that the same construction as the first and second read circuits 102a, 102b can be applied to other nonvolatile memory cells to read data stored in the other nonvolatile memory cells.

Referring to FIG. 6, the nonvolatile memory device according to an exemplary embodiment of the inventive concept is substantially the same as the nonvolatile memory device according to the exemplary embodiment of FIG. 5, except that the nonvolatile memory device includes the first read circuit 102a that reads the resistance levels of the first nonvolatile memory cells that are relatively near the strapping node SN1, and the second read circuit 102b that reads the resistance levels of the second nonvolatile memory cells that are relatively far from the strapping node SN1.

Specifically, the first read circuit 102a is a circuit for reading data stored in the first nonvolatile memory cells that are relatively near the strapping node SN1. The first read circuit 102a provides the first read bias current Icell1 to the selected nonvolatile memory cell MC0, and reads the data stored in the first nonvolatile memory cell MC0 using the corresponding level change of a first sensing node VSA1. The first read circuit 102a includes a discharge unit, a precharge unit, a clamping unit, a first read bias providing unit 132a, and a first sensing unit 150a. In the first read circuit 102a, the first read bias providing unit 132a provides the first read bias current Icell1 to the first sensing node VSA1 using the first biasing selection signal PBIAS1 and the first control bias VBIAS1, and the first sensing unit 150a compares the corresponding level of the first sensing node VSA1 with the reference bias level VREF to read the data stored in the first nonvolatile memory cell.

By contrast, the second read circuit 102b is a circuit for reading data stored in the second nonvolatile memory cells that are relatively far from the strapping node SN1. The second read circuit 102b provides the second read bias current Icell2 to the selected nonvolatile memory cell MCk, and reads the data stored in the second nonvolatile memory cell MCk using the corresponding level change of a second sensing node VSA2. Here, the second sensing node VSA2 may be electrically separated from the first sensing node VSA1.

The second read circuit 102b includes a discharge unit, a precharge unit, a clamping unit, a second read bias providing unit 132b, and a second sensing unit 150b. In the second read circuit 102b, the second read bias providing unit 132b provides the second read bias current Icell2 to the second sensing node VSA2 using the second biasing selection signal PBIAS2 and the second control bias VBIAS2, and the second sensing unit 150b compares the corresponding level of the second sensing node VSA2 with the reference bias level VREF to read the data stored in the second nonvolatile memory cell. Here, the level of the second control bias VBIAS2 provided to the second read bias providing unit 102b may be higher than the level of the first control bias VBIAS1 provided to the first read bias providing unit 102a.

Figure 7:
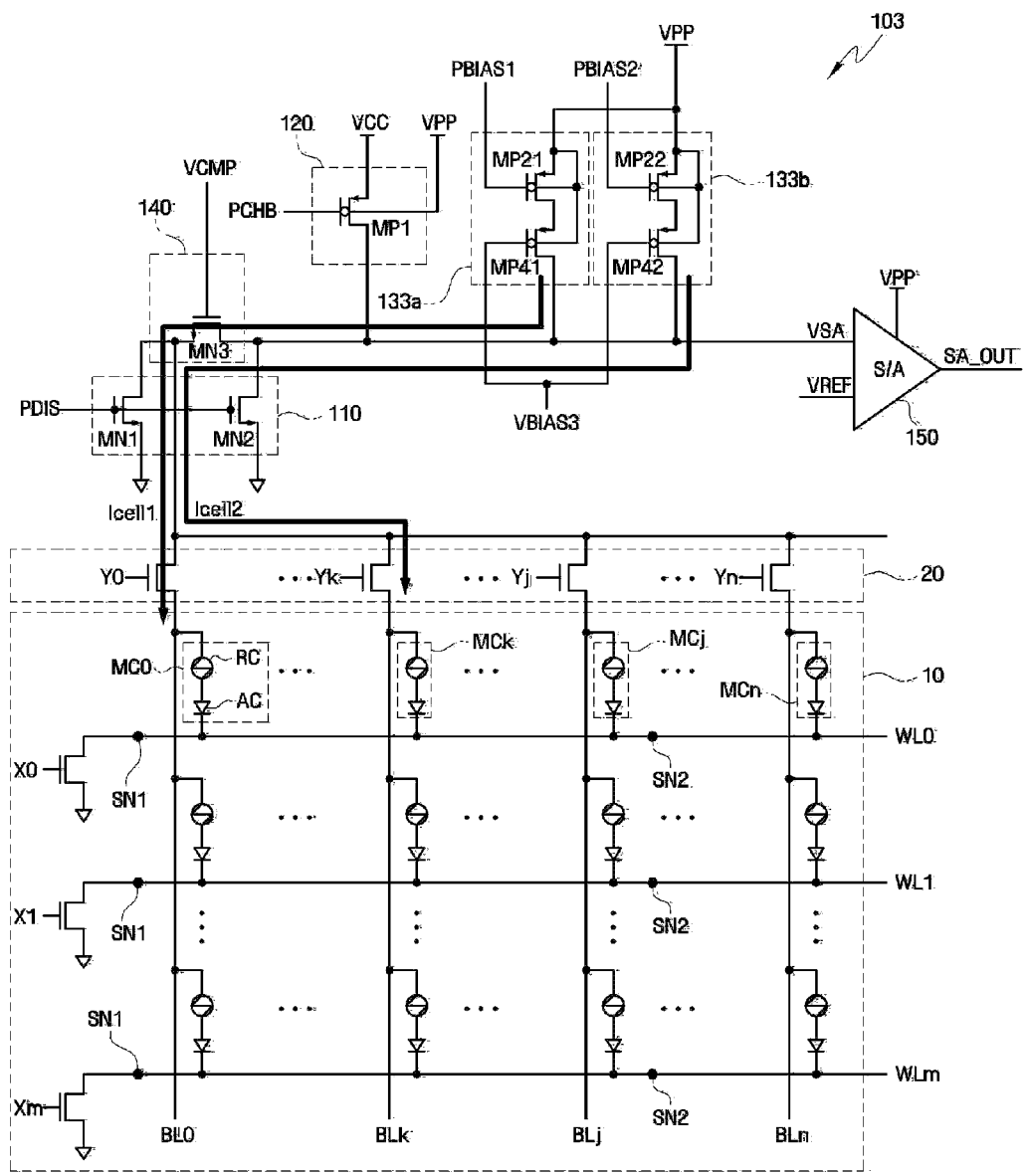
FIG. 7 is a circuit diagram for explaining the operation of a nonvolatile memory device according to an exemplary embodiment of the inventive concept.

FIG. 7 is a circuit diagram for explaining the operation of a nonvolatile memory device according to an exemplary embodiment of the inventive concept.

Referring to FIG. 7, the nonvolatile memory device is substantially the same as the nonvolatile memory device according to the exemplary embodiment of FIG. 5, except that a control bias VBIAS3 of the same level is provided to first and second read bias providing units 133a, 133b, and the resistance levels of transistors MP41, MP42, to which the control bias VBIAS3 is applied, differ according to the first and second read bias providing units 133a, 133b.

Specifically, in the read circuit 103 of FIG. 7, the resistance levels of the transistors MP41, MP42, to which the control bias VBIAS3 is applied, differ according to the first and second read bias providing units 133a, 133b even if the control bias VBIAS3 of the same level is provided to the first and second read bias providing units 133a, 133b, and thus substantially the same operation as the embodiment of FIG. 5 can be performed. For example, the first read bias providing unit 133a includes the transistor MP41 having a relatively high-level resistance, and thus the level of the first read bias current Icell1 may be relatively low even if the control bias VBIAS3 of the same level is applied to the gate of the transistor MP41. By contrast, the second read bias providing unit 133b includes the transistor MP42 having a relatively low-level resistance, and thus the level of the second read bias current Icell2 may be relatively high even if the control bias VBIAS3 of the same level is applied to the gate of the transistor MP42.

Here, several methods of controlling the resistance of the transistor MP41 of the first read bias providing unit 133a to be higher than that of the transistor MP42 of the second read bias providing unit 133b may be used. For example, the size of the transistor MP42 of the second read bias providing unit 133b may be set to be smaller than that of the transistor MP41 of the first read bias providing unit 133a. That is, by enlarging the width of a channel region or reducing the length of the channel region, the ratio of width to length (W/L) can be lowered. Also, the doping density of the channel region of the transistor MP41 included in the first read bias providing unit 133a may be set to be lower than that of the channel region of the transistor MP42 included in the second read bias providing unit 133b.

In FIG. 7 the PMOS transistors are illustrated as the transistors MP41, MP42 receiving the control bias through their gates. However, the feature of the transistors is not limited thereto. In an exemplary embodiment of the inventive concept, NMOS transistors can be used as the transistors MP41, MP42.

Figure 8:
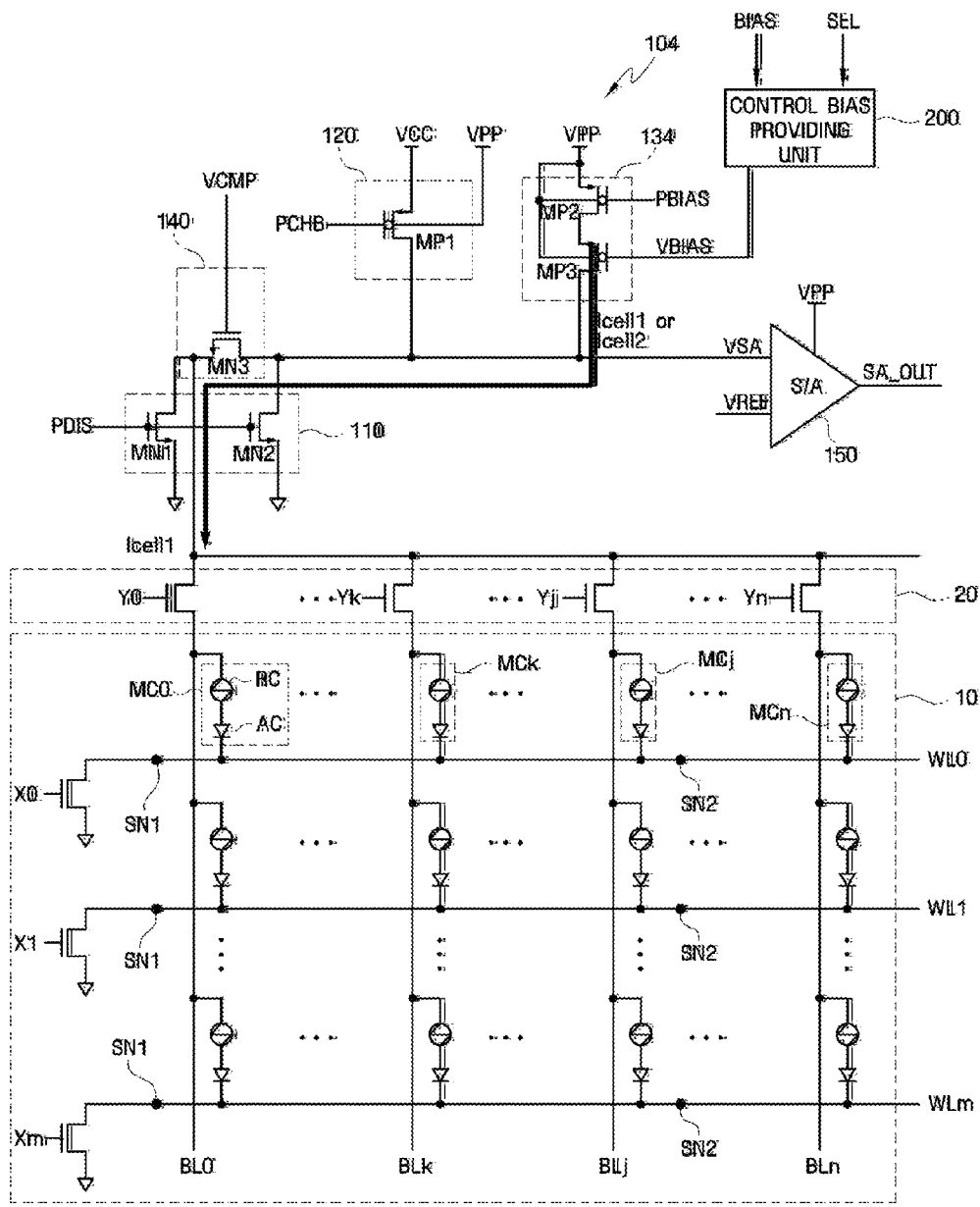
FIG. 8 is a circuit diagram for explaining the operation of a nonvolatile memory device according to an exemplary embodiment of the inventive concept.

FIG. 8 is a circuit diagram for explaining the operation of a nonvolatile memory device according to an exemplary embodiment of the inventive concept.

Referring to FIG. 8, the nonvolatile memory device according to an exemplary embodiment of the inventive concept is substantially similar to the nonvolatile memory devices according to the previous embodiments, except that the nonvolatile memory device includes a read bias providing unit 134 and a control bias providing unit 200 providing control biases VBIAS of different levels to the read bias providing unit 134.

Specifically, a read circuit 104 of a nonvolatile memory device according to an exemplary embodiment of the inventive concept includes a discharge unit 110, a precharge unit 120, a clamping unit 140, a read bias providing unit 134, and a sensing unit 150. Here, since the discharge unit 110, the precharge unit 120, the clamping unit 140, and the sensing unit 150 have been described in detail with reference to FIG. 5, the detailed description thereof will be omitted.

The read bias providing unit 134, in order to read the resistance level of the selected nonvolatile memory cells MC0-MCn, provides read bias currents Icell1, Icell2 of different levels to the sensing node VSA in accordance with the positions of the selected nonvolatile memory cells MC0-MCn using a biasing selection signal PBIAS and a control bias VBIAS. For example, the read bias providing unit 134 receives the control bias VBIAS of a relatively low level, and provides the read bias current Icell1 of a relatively low level to the sensing node VSA. Also, the read bias providing unit 134 receives the control bias VBIAS of a relatively high level, and provides the read bias current Icell2 of a relatively high level to the sensing node VSA.

The read bias providing unit 134, as illustrated in FIG. 8, includes a first PMOS transistor MP2 coupled between the boosted voltage VPP and a second PMOS transistor MP3 to receive the biasing selection signal PBIAS through its gate, and the second PMOS transistor coupled between the first PMOS transistor MP2 and the sensing node VSA to receive the control bias VBIAS through its gate. Here, a substrate region, on which the first and second PMOS transistors MP2, MP3 are formed, may be coupled to the boosted voltage VPP, respectively.

The control bias providing unit 200 selects one of the drive biases having different levels in accordance with a selection signal SEL obtained by using an address (specifically, a column address), and provides the selected drive bias as the control bias VBIAS. That is, the control bias providing unit 200 provides the control biases VBIAS having different levels in accordance with the positions of the nonvolatile memory cells selected among the nonvolatile memory cells MC0-MCn coupled to the word lines WL0-Wln. For example, the control bias providing unit 200 provides the control bias VBIAS of a relatively low level to the read bias providing unit 134 corresponding to the column address for selecting the first nonvolatile memory cell MC0 which is relatively near the strapping nodes SN1, SN2. By contrast, the control bias providing unit 200 provides the control bias VBIAS of a relatively high level to the read bias providing unit 134 corresponding to the column address for selecting the second nonvolatile memory cell MCk which is relatively far from the strapping nodes SN1, SN2. Accordingly, the nonvolatile memory device according to the embodiment of FIG. 8 performs substantially the same operation as that of the nonvolatile memory device according to the embodiment of FIG. 5.

Figure 9:
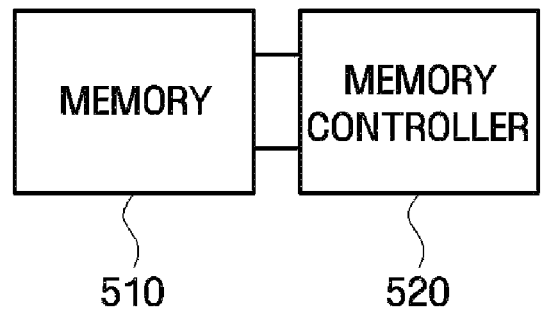
FIGS. 9, 10 and 11 are block diagrams of nonvolatile memory devices according to exemplary embodiments of the inventive concept.
Figure 10:
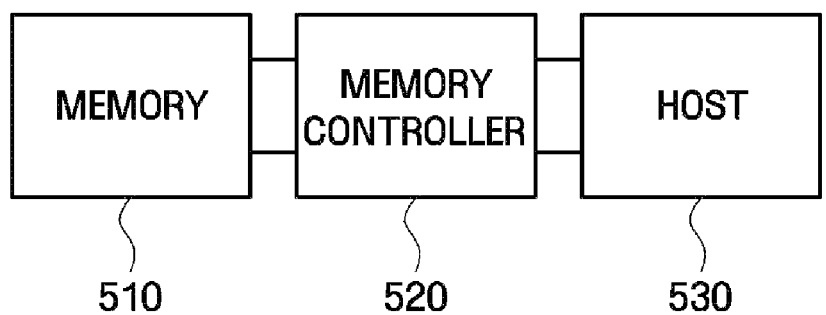
Figure 11:
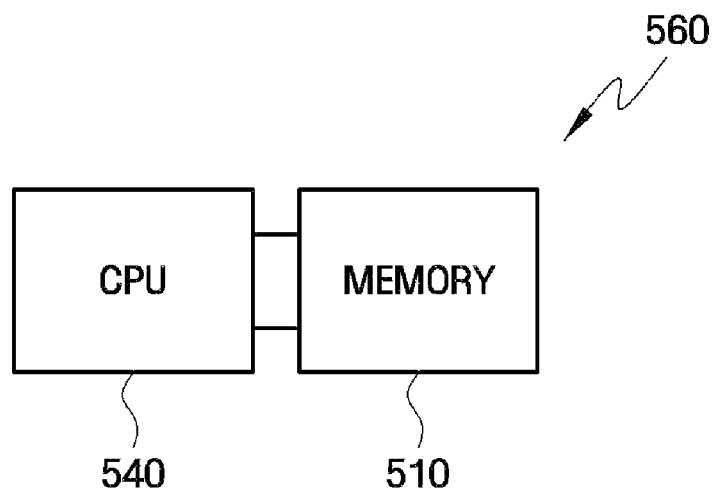

FIGS. 9 to 11 are block diagrams of exemplary sub-systems which can utilize nonvolatile memory devices according to exemplary embodiments of the inventive concept.

Referring to FIG. 9, a sub-system according to an exemplary embodiment of the inventive concept includes a memory 510, and a memory controller 520 connected to the memory 510. Here, the memory 510 is a nonvolatile memory device as described above, and the memory controller 520 provides an input signal corresponding to the control of the operation of the memory 510, for example, a command signal for controlling a read operation and a write operation, and an address signal.

The sub-system including the memory 510 and the memory controller 520 as described above may be embodied in a card such as a memory card. Specifically, the sub system may be embodied in a card that satisfies a specified industry standard used in an electronic device, such as a portable phone, a two-way communication system, a one-way pager, a two-way pager, a personal communication system, a portable computer, a personal data assistance (PDA), an audio and/or video player, a digital and/or video camera, a navigation system, and a global positioning system. However, the present system is not limited thereto, and the system according to an embodiment of the present invention may be embodied in diverse forms such as a memory stick and the like.

Referring to FIG. 10, a sub-system according to an exemplary embodiment of the inventive concept includes a memory 510, a memory controller 520, and a host system 530. Here, the host system 530 is connected to the memory controller 520 through a bus or the like, and makes the memory controller 520 control the operation of the memory 510 by providing a control signal to the memory controller 520. The host system 530, for example, may be a processing system for use in a portable phone, a two-way communication system, a one-way pager, a two-way pager, a personal communication system, a portable computer, personal data assistance (PDA), an audio and/or video player, a digital and/or video camera, a navigation system, and a global positioning system.

FIG. 10 illustrates that the memory controller 520 is interposed between the memory 510 and the host system 530, but the position of the memory controller 520 is not limited thereto. In the system according to an exemplary embodiment of the inventive concept, the memory controller 520 may be selectively omitted.

Referring to FIG. 11, a computer sub-system according to an exemplary embodiment of the inventive concept may be a sub-system 560 including a CPU (Central Processing Unit) 540 and a memory 510. In the computer sub-system 560, the memory 510 is connected to the CPU 540 directly or through a typical computer bus architecture. The memory 510 may store an operating system (OS), an instruction set such as a Basic Input/Output Startup (BIOS) instruction set, an Advanced Configuration and Power Interface (ACPI) instruction set, and the like, or may be used as a large-capacity storage device.

In FIG. 11, all constituent elements included in the computer system 560 are not illustrated for convenience in explanation, and the present invention is not limited thereto. Although the memory controller 520 interposed between the memory 510 and the CPU 540 is omitted in FIG. 11, the memory controller 520 may be interposed between the memory 510 and the CPU 540 in an exemplary embodiment of the inventive concept.

Although practical exemplary embodiment of the inventive concept have been described for illustrative purposes, those skilled in the art will appreciate that various modifications, additions and substitutions are possible, without departing from the scope and spirit of the invention as disclosed in the accompanying claims.

What is claimed is:

1. A nonvolatile memory device comprising:
   at least a first nonvolatile memory cell and a second nonvolatile memory cell;
   a word line coupled to the first nonvolatile memory cell and to the second nonvolatile memory cell;
   a first bit line coupled to the first nonvolatile memory cell;
   a second bit line coupled to the second nonvolatile memory cell; and
   a read circuit that reads a resistance level of the first nonvolatile memory cell and a resistance level of the second nonvolatile memory cell by providing a first read bias current and second read bias current of different levels to the first bit line and to the second bit line, respectively,
   wherein:
      the word line includes a first sub word line and a second sub word line connected to each other through a strapping node,
      the first nonvolatile memory cell is nearer to the strapping node than the second nonvolatile memory cell, and
      a level of the first read bias current is lower than a level of the second read bias current.

2. The nonvolatile memory device of claim 1, wherein the first sub word line is a polysilicon layer, and the second sub word line is a metal layer formed on the polysilicon layer.

3. The nonvolatile memory device of claim 1,
   wherein the read circuit comprises:
      a first read bias providing unit that provides the first read bias current, and
      a second read bias providing unit that provides the second read bias current; and
      wherein the first read bias providing unit and the second read bias providing unit are selectively enabled in response to a biasing selection signal formed using an address signal.

4. The nonvolatile memory device of claim 3, wherein the first read bias providing unit provides the first read bias current using a first control bias, and the second read bias providing unit provides the second read bias current using a second control bias having a different level from the first control bias.

5. The nonvolatile memory device of claim 3, wherein:
   the first read bias providing unit provides the first read bias current using a control bias applied to a gate of a first transistor,
   the second read bias providing unit provides the second read bias current using the control bias applied to a gate of a second transistor, and
   the first transistor and the second transistor have different resistance levels.

6. The nonvolatile memory device of claim 3, wherein the read circuit comprises:
   a sensing node coupled to the first read bias providing unit and the second read bias providing unit, and selectively coupled to the first bit line and the second bit line; and a sensing unit coupled to the sensing node to compare the level of the sensing node with the level of a reference bias to output a comparison result.

7. The nonvolatile memory device of claim 3, wherein the read circuit comprises:
   a first sensing node coupled to the first bit line and the first read bias providing unit;
   a first sensing unit coupled to the first sensing node to compare the level of the first sensing node with the level of a reference bias to output a comparison result;
   a second sensing node coupled to the second bit line and the second read bias providing unit, and electrically separated from the first sensing node; and
   a second sensing unit coupled to the second sensing node to compare the level of the second sensing node with the level of the reference bias to output a comparison result.

8. The nonvolatile memory device of claim 1, wherein the read circuit comprises:
   a control bias providing unit that selects one of drive biases having different levels in accordance with addresses and provides the selected drive bias as a control bias; and
   a read bias providing unit that provides the read bias current using the control bias.

9. The nonvolatile memory device of claim 1, wherein the nonvolatile memory cell is a diode-controlled PRAM cell.

10. A non-volatile memory device comprising:
    a first memory cell coupled to a first bit line and a word line;
    a second memory cell coupled to the word line and to a second bit line adjacent the first bit line, the word line having a resistance between the first memory cell and the second memory cell; and
    a read bias current providing apparatus configured to provide a first bias current to the first memory cell and a second bias current to the second memory cell;
    wherein a current level differential between the first bias current and the second bias current corresponds to the resistance of the word line between the first memory cell and the second memory cell, and
    wherein:
       the word line includes a first sub word line and a second sub word line connected to each other through a strapping node,
       the first memory cell is nearer to the strapping node than the second memory cell, and
       a level of the first bias current is lower than a level of the second bias current.

\* \* \* \* \*